United States Patent
Volpert

(10) Patent No.: US 11,569,411 B2
(45) Date of Patent: Jan. 31, 2023

(54) METHOD FOR FORMING A COMMON ELECTRODE OF A PLURALITY OF OPTOELECTRONIC DEVICES

(71) Applicant: COMMISSARIAT A L'ENERGIE ATOMIQUE ET AUX ENERGIES ALTERNATIVES, Paris (FR)

(72) Inventor: Marion Volpert, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 266 days.

(21) Appl. No.: 17/097,639

(22) Filed: Nov. 13, 2020

(65) Prior Publication Data
US 2021/0159359 A1    May 27, 2021

(30) Foreign Application Priority Data
Nov. 21, 2019 (FR) ..................................... 1913028

(51) Int. Cl.
*H01L 33/00* (2010.01)
*H01L 27/15* (2006.01)
*H01L 33/38* (2010.01)

(52) U.S. Cl.
CPC .......... *H01L 33/005* (2013.01); *H01L 27/156* (2013.01); *H01L 33/38* (2013.01); *H01L 2933/0016* (2013.01); *H01L 2933/0066* (2013.01)

(58) Field of Classification Search
None
See application file for complete search history.

(56) References Cited

U.S. PATENT DOCUMENTS

| 9,997,561 | B2 * | 6/2018 | Cha ....................... H01L 33/507 |
| 10,468,452 | B2 | 11/2019 | Robin et al. |
| 2007/0262333 | A1 * | 11/2007 | Takeuchi ........... B65H 23/1884 257/E27.121 |

(Continued)

FOREIGN PATENT DOCUMENTS

EP    3 401 958 A1    11/2018

OTHER PUBLICATIONS

French Preliminary Search Report dated Jul. 17, 2020 in French Application 19 13028 filed Nov. 21, 2019 (with English Translation of Categories in Cited Documents), 2 pages.

(Continued)

*Primary Examiner* — Bilkis Jahan
(74) *Attorney, Agent, or Firm* — Oblon, McClelland, Maier & Neustadt, L.L.P.

(57) ABSTRACT

A method for forming a common electrode is provided, including: a) providing a support substrate on which rest optoelectronic devices separated by trenches; b) forming a dielectric layer on front faces, flanks, and a bottom of the trenches, of a thickness E1 and a thickness E2, which is less than the thickness E1, at, respectively, the front faces and the flanks; c) etching a thickness E3 of the dielectric layer, so as to uncover the flanks at a first section of the trenches; d) forming a metal layer filling the trenches and covering the front faces; and e) performing a mechanochemical polishing of the metal layer, the polishing stopping on a portion of the dielectric layer, the metal layer remaining in the trenches forming the common electrode.

12 Claims, 6 Drawing Sheets

(56) References Cited

U.S. PATENT DOCUMENTS

| | | | | |
|---|---|---|---|---|
| 2009/0057693 A1* | 3/2009 | Takeuchi | .............. | H01L 27/153 |
| | | | | 257/E33.001 |
| 2014/0159074 A1* | 6/2014 | Isobe | .................. | H01L 27/3246 |
| | | | | 438/34 |
| 2015/0295009 A1 | 10/2015 | Wang et al. | | |
| 2016/0064613 A1* | 3/2016 | Chiu | .................... | H01L 33/405 |
| | | | | 438/34 |
| 2018/0301594 A1* | 10/2018 | Bouvier | ................ | H01L 33/382 |

OTHER PUBLICATIONS

U.S. Appl. No. 16/472,037, filed Jun. 20, 2019, US 2020/0035864 A1, Bertrand Chambion et al.

U.S. Appl. No. 16/851,165, filed Apr. 17, 2020, US 2020/0343296 A1, Adrien Gasse et al.

U.S. Appl. No. 16/954,891, filed Jun. 17, 2020, Marion Volpert et al.

* cited by examiner

METHOD FOR FORMING A COMMON ELECTRODE OF A PLURALITY OF OPTOELECTRONIC DEVICES

TECHNICAL FIELD

The invention relates to the fields of microelectronics and optoelectronics. Particularly, the invention relates to a method for forming electrical contacts at the flanks of devices, and more particularly light emitting diodes, resting on a main face of a support substrate.

The present invention is in particular implemented for the simplified manufacture, and with an increased control, of an electrode on the flanks of LEDs having in particular significant aspect ratios.

PRIOR ART

An emitting display device known from the prior art generally comprises an assembly of light emitting diodes (LEDs), in particular based on gallium nitride.

Said LEDs comprise, from the front face thereof to the rear face thereof, an N-doped semiconductor layer, an assembly of emitting layers as well as a P-doped semiconductor layer, and rest, by the rear face thereof, on a support substrate provided with a control circuit intended to individually address each of said LEDs at the P-doped semiconductor layer thereof.

The emitting display device further comprises a common electrode electrically contacting the N-doped semiconductor layer of each of the LEDs. Said electrical contact is generally taken at the flank of the semiconductor layer.

Thus, a method for forming an emitting display device known from the prior art is illustrated in FIGS. 1A to 1G.

The method comprises in particular a step, illustrated in FIG. 1A, of providing a support substrate 111 on a main face of which an integrated control circuit 110 is formed. The integrated circuit comprises in particular metal connection studs 113, isolated from one another by dielectric areas 114, and intended to connect the LEDs by the rear face thereof.

FIG. 1B is a schematic representation of a stack of layers 150 formed on a main face of a support substrate 151. The stack of layers comprises in particular, from the main face, an N-doped semiconductor layer 153, an assembly of emitting layers 155 as well as a P-doped semiconductor layer 157. Each of said layers may comprise gallium nitride.

The stack of layers 150, according to the method known from the prior art, is subsequently transferred on the main face of the support substrate 111 (FIG. 1C). Said transfer may comprise a step of bonding the stack 150 on the integrated circuit 110 followed by removal of the support substrate 151.

One or two intermediate metal layers 116 and 159 may moreover be formed, respectively, on the integrated circuit 110 and on the stack 150 before the bonding step.

The transfer step is then followed by a step during which trenches 170 are formed in the stack 150 from the face exposed to the external environment of said stack, and that extend over the entire thickness thereof in order to delimit a plurality of LEDs 172 (FIG. 1D).

The formation of trenches generally involves the following successive steps:
- a step of forming a hard mask layer, for example a dielectric material layer, by covering the exposed face of the stack 150,
- a step of photolithography intended to delimit patterns 120 at the hard mask layer with the aid of a photolithographic resin layer,
- a step of etching the hard mask layer so as to form the patterns 120 of a hard mask,
- a step of removing the photolithographic resin implemented during the photolithographic step,
- a step of etching the stack 150 through the hard mask so as to delimit the LEDs.

The etching step may be continued so as to also remove the portions of the layers 116 and 159 from the bottom of the trenches 170.

Thus, at the end of said step, the support substrate 111 comprises a plurality of LEDs separated from one another by the trenches 170.

Particularly, the LEDs rest by the rear face thereof on the main face of the support substrate 111, whereas the front face of each of same, opposite the rear face and connected to said latter by a flank, is covered with a hard mask pattern 120. The trenches 170 are thus delimited by a bottom, at the main face of the support substrate, and by the flanks of the LEDs.

The formation of the LEDs is then followed by a step of passivating said latter (FIG. 1E). The passivation comprises in particular the formation of a passivation film 190 by covering with hard mask patterns 120, the flanks 180 of the LEDs 172 and the bottom of the trenches 170.

A step of partially removing the passivation layer is then performed. Said step comprises in particular the removal of a portion of the passivation layer by covering with patterns 120 and a first section of the flanks that extend, from the front face of the LEDs, over a depth less than the thickness of the N-doped semiconductor layer (FIG. 1F).

In other terms, at the end of said step, the passivation layer 190 is kept on a second section that extends from the bottom of the trenches and over a height that corresponds at least to the combined thickness of the intermediate metal layers 116 and 159, of the P-doped semiconductor layer 157 and of the assembly of emitting layers 155.

The removal in particular implements a photography step that comprises the filling of the second section of the trenches by a photolithographic resin, followed by a step of etching the passivation layer at the patterns 120 and the first section.

Finally, the common electrode is formed by filling the trenches 170 by a metal species.

The formation of the common electrode involves in particular the growth of a metal layer, for example by electrodeposition by covering with patterns 120 and filling the trenches.

A step of mechanochemical polishing, stopping on the hard mask patterns 120, is subsequently performed so as to keep only the metal in the trenches.

However, said method is not satisfactory.

Indeed, the thickness of the hard mask patterns 120 is not perfectly controlled during, and is particularly inhomogeneous from one pattern to another at the end of the step of forming trenches.

The result of said inhomogeneity is a significant variability of the first sections from one trench to another, and consequently, a difficulty in accurately controlling the range of the contact area between the common electrode and the N-doped semiconductor layer of each of the LEDs.

One aim of the present invention is therefore to propose a method for forming a common electrode that is easier to implement.

Another aim of the present invention is also to propose a method for forming a common electrode that is more reliable and having less variability than the methods known from the prior art.

DESCRIPTION OF THE INVENTION

The aims of the present invention are, at least partially, achieved by a method for forming a common electrode with a plurality of optoelectronic devices each comprising a front face and a rear face connected by a flank, the method comprising the steps of:

a) providing a support substrate on a face of which, known as main face, rest, by the rear face thereof, the plurality of optoelectronic devices separated by trenches, said trenches being delimited by the flanks of said optoelectronic devices and a bottom at the main face;

b) forming a dielectric layer by covering the front faces as well as the flanks and the bottom of the trenches, the dielectric layer having a thickness E1 and a thickness E2, less than the thickness E1, at, respectively, the front faces and the flanks;

c) wet etching a thickness E3 of the dielectric layer, less than the thickness E1, and so as to uncover the flanks at a first section of the trenches and keep at least partially the dielectric layer on the front faces;

d) forming a metal layer filling the trenches and covering the front faces;

e) performing a mechanochemical polishing of the metal layer, said polishing stopping on the portion of the dielectric layer kept at the end of step c), the metal remaining in the trenches forming the common electrode.

According to one implementation, each trench comprises, from the bottom and adjacent to one another, a second section and the first section extending, respectively, according to a second and a first height, the first section leading into a plane formed by the front faces of the optoelectronic devices.

According to one implementation, the thickness E1 is at least 2 times greater than the thickness E2.

According to one implementation, step b) is preceded by step b0) of forming, according to a compliant deposition technique, a passivation layer by covering the front faces as well as the flanks and the bottom of the trenches, step b) also making it possible to remove the passivation layer at the first section.

According to one implementation, step b0) is performed by atomic layer deposition.

According to one implementation, the passivation layer comprises at least materials chosen from: $SiO_2$, $Al_2O_3$.

According to one implementation, the passivation layer has a thickness between 5 nm and 30 nm.

According to one implementation, the dielectric layer is formed by a plasma-activated chemical vapour deposition technique.

According to one implementation, the dielectric layer comprises at least one of the materials chosen from: $SiO_2$, $Si_3N_4$.

Silicon nitride, Si3N4, considered in the present invention is not necessarily stoichiometric.

According to one implementation, step a) comprises the transfer of a stack of layers, formed on a seed substrate, on the main face of the support substrate.

According to one implementation, the transfer of the stack of layers is followed by the formation of trenches that extend over the entire thickness of the stack.

According to one implementation, the formation of trenches implements a hard mask that is removed before performing step b).

According to one implementation, the optoelectronic devices are light emitting diodes that comprise from the front face thereof to the rear face thereof, a first N-doped semiconductor layer, an assembly of emitting layers as well as a second P-doped semiconductor layer, the first height being less than or equal to the thickness of the N-doped semiconductor layer.

According to one implementation, the support substrate comprises on the main face thereof an integrated circuit intended to individually address each of the electronic devices.

BRIEF DESCRIPTION OF THE DRAWINGS

Other features and advantages will become apparent in the following description of a method for forming electrical contacts of a plurality of optoelectronic devices according to the invention, given by way of non-limiting examples, with reference to the appended drawings wherein.

DETAILED DESCRIPTION OF SPECIFIC EMBODIMENTS

The same elements have been designated by the same references to the various figures and, in addition, the various figures are not drawn to scale. In the interest of clarity, only the elements that are useful for understanding the embodiments described have been shown and are described in detail.

Particularly, the embodiment of an integrated control circuit, known per se by the person skilled in the art, is not described in detail.

The present invention relates to a method for manufacturing a common electrode with optoelectronic devices resting by the rear face thereof on a main face of a support substrate.

The remainder of the description will be limited to optoelectronic devices formed by light emitting diodes (hereafter "LEDs"). However, the person skilled in the art may apply the invention to any other type of device, for example photodiodes.

It can be seen in FIGS. 2A to 2E schematic representations of the various steps of a method for manufacturing a common electrode with a plurality of light emitting diodes 172 each comprising a front face 151a and a rear face 151b connected by a flank 151c.

Figure 1A:
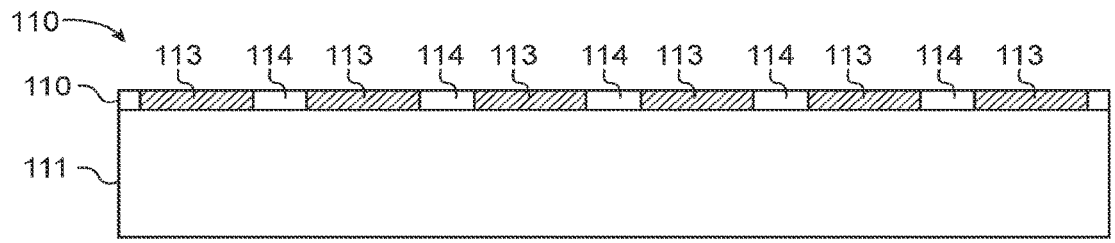
FIGS. 1A, 1B, 1C, 1D, 1E, 1F, 1G are schematic representations of the various steps implemented for the manufacture of an emitting display device according to a method known from the prior art, the views relating to said figures are in particular shown according to a sectional plane perpendicular to the main face of the support substrate.
Figure 1B:
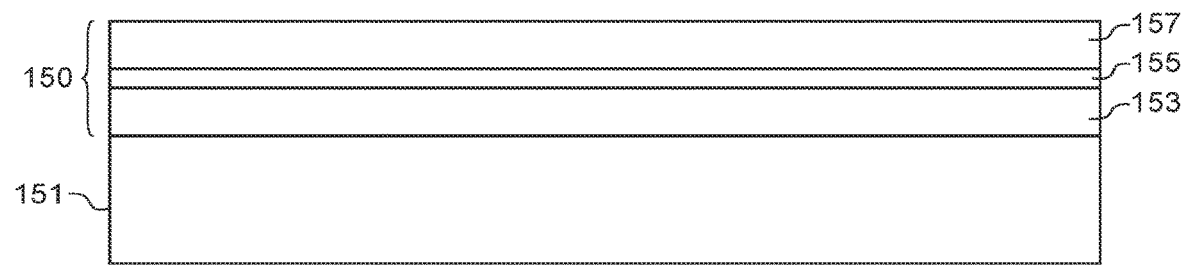
Figure 1C:
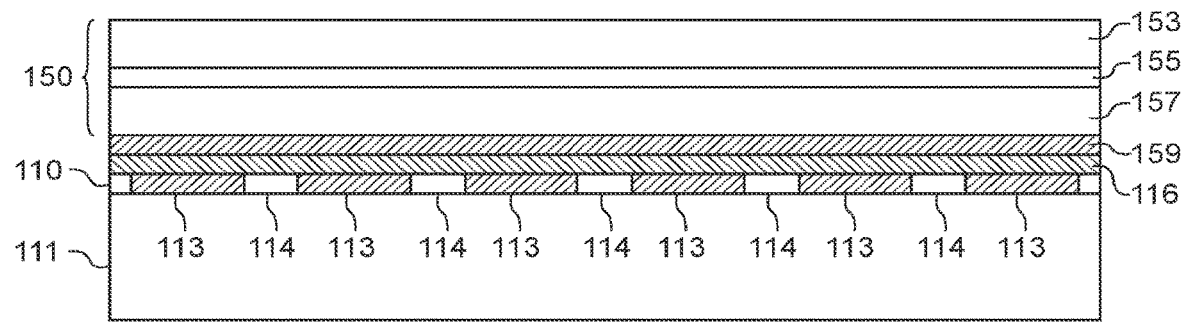
Figure 1D:
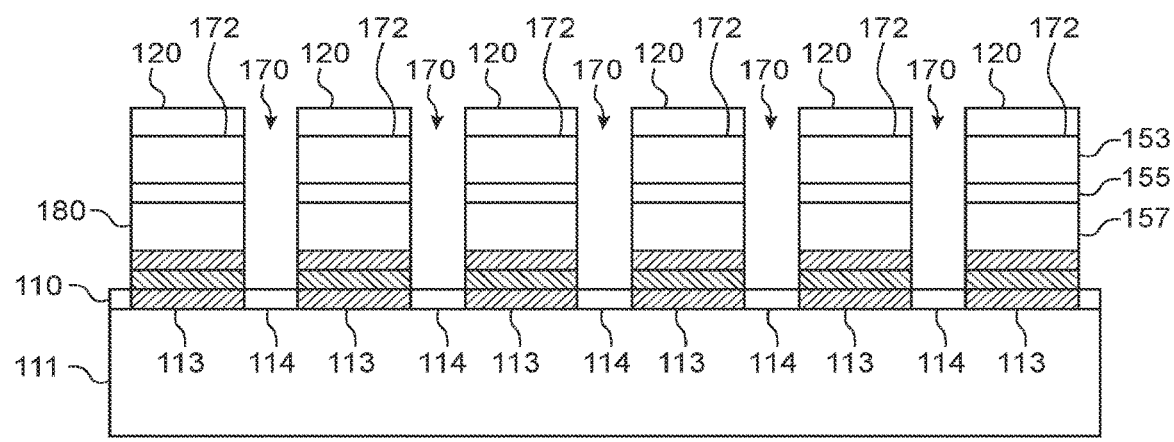
Figure 1E:
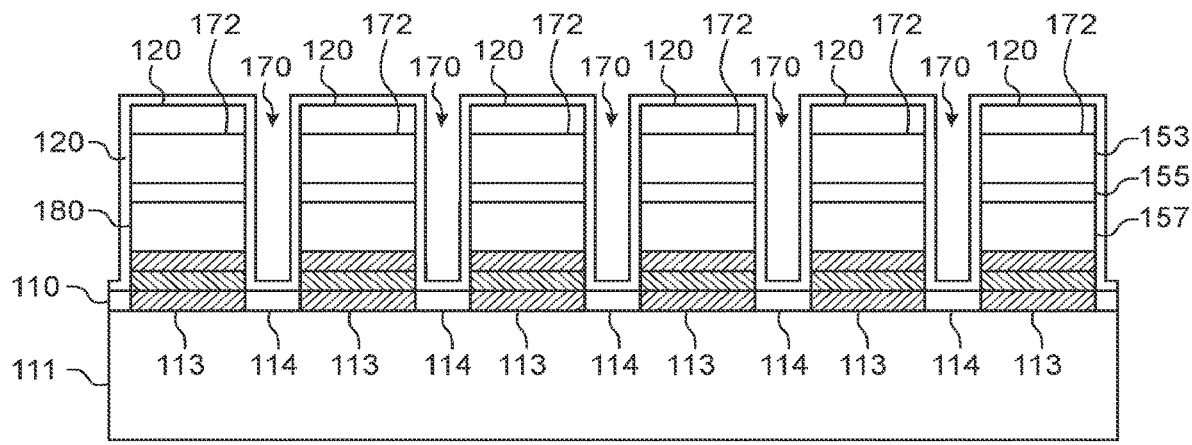
Figure 1F:
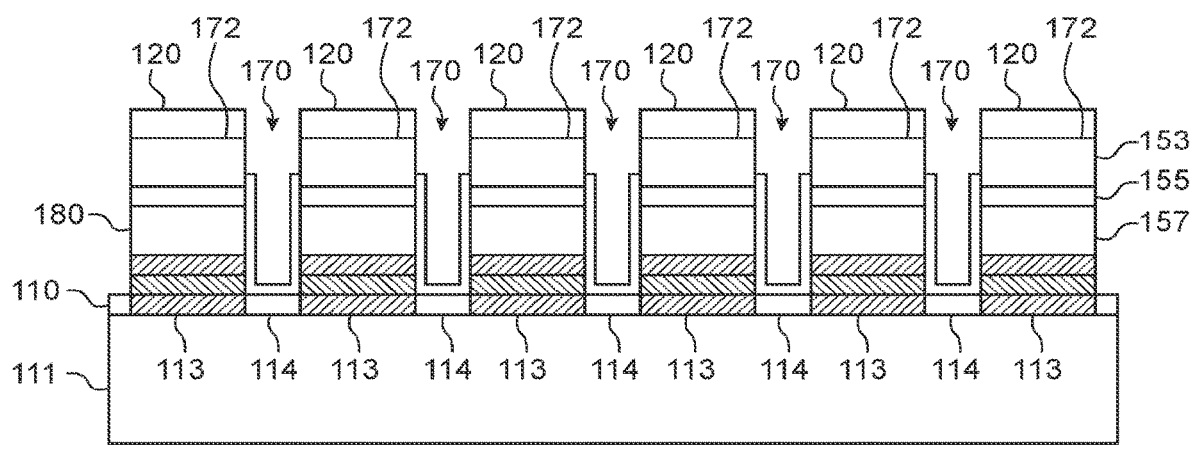
Figure 1G:
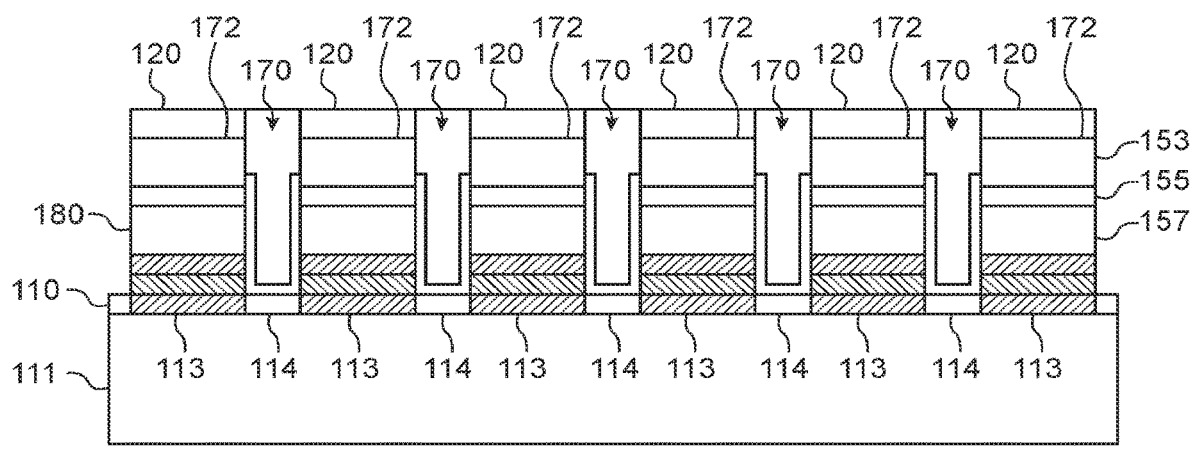
Figure 2A:
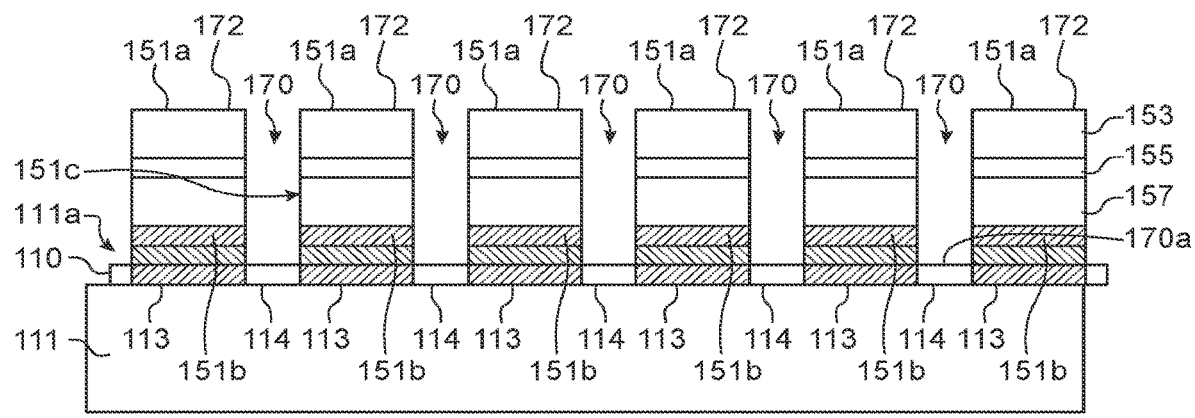
FIGS. 2A, 2B, 2C, 2D, 2E are schematic representations of the various steps implemented for the manufacture of an emitting display device according to the present invention, the views relating to said figures are in particular shown according to a sectional plane perpendicular to the main face of the support substrate.

In particular, the method comprises step a) of providing a support substrate 111 on a face of which, known as main face 111a, rest, by the rear face 151b thereof, the plurality of light emitting diodes 172 separated by trenches 170 (FIG. 2A).

The trenches 170 are in particular delimited by the flanks 151c of the light emitting diodes 172 and a bottom 170a at the main face 111a.

The support substrate 111 may comprise, on the main face 111a thereof, an integrated circuit intended to individually address each of the light emitting diodes 172.

Particularly, the integrated circuit may comprise metal connection studs 113, isolated from one another by dielectric areas 114.

The metal connection studs 113 are in particular intended to be connected to each of the rear faces 151b of the light emitting diodes 172 and thus be able to control said latter.

The integrated circuit may also comprise, associated with each light emitting diode 172, an elementary cell provided with one or more transistors for controlling the current circulating in said diode.

Figure 3A:
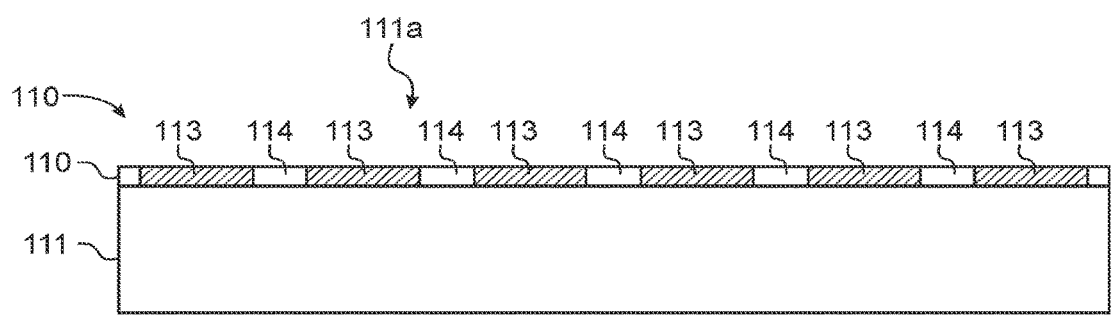
FIGS. 3A, 3B, 3C, 3D, 3E, 3F are schematic representations of the various steps likely to be implemented for performing step a) of the method of the present invention, the views relating to said figures are in particular shown according to a sectional plane perpendicular to the main face of the support substrate.
Figure 3B:
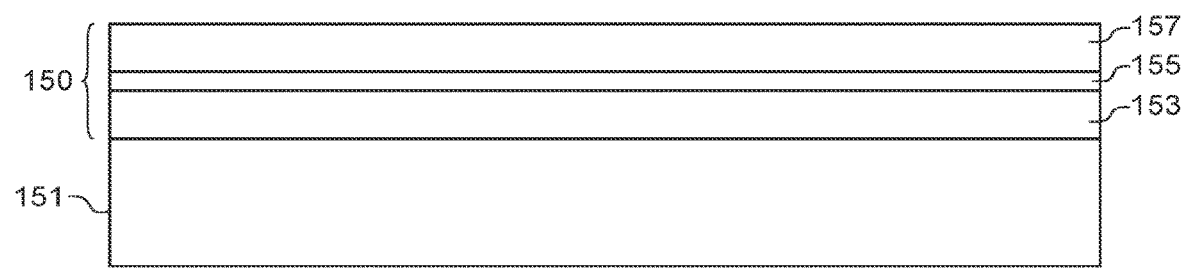
Figure 3C:
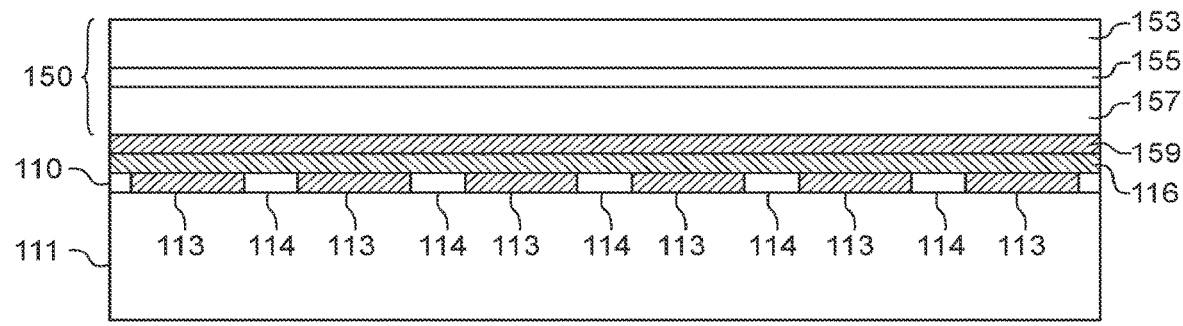
Figure 3D:
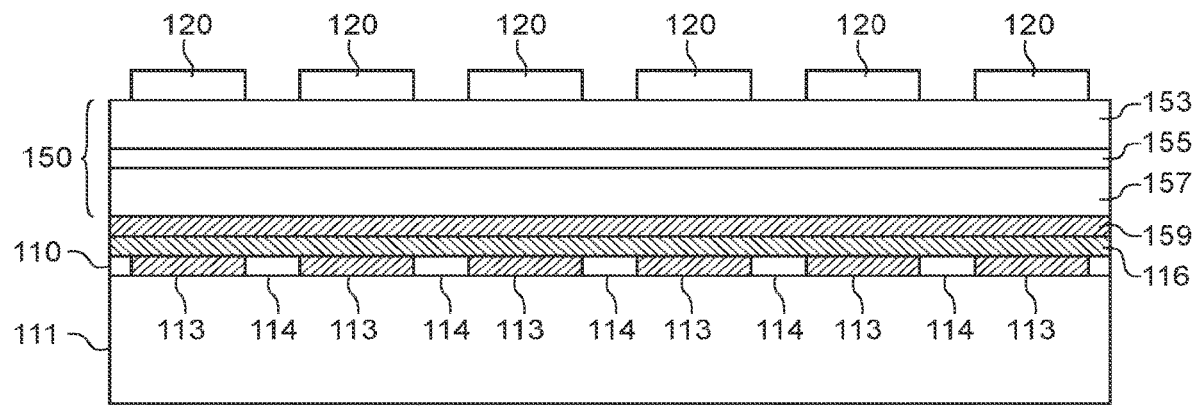
Figure 3E:
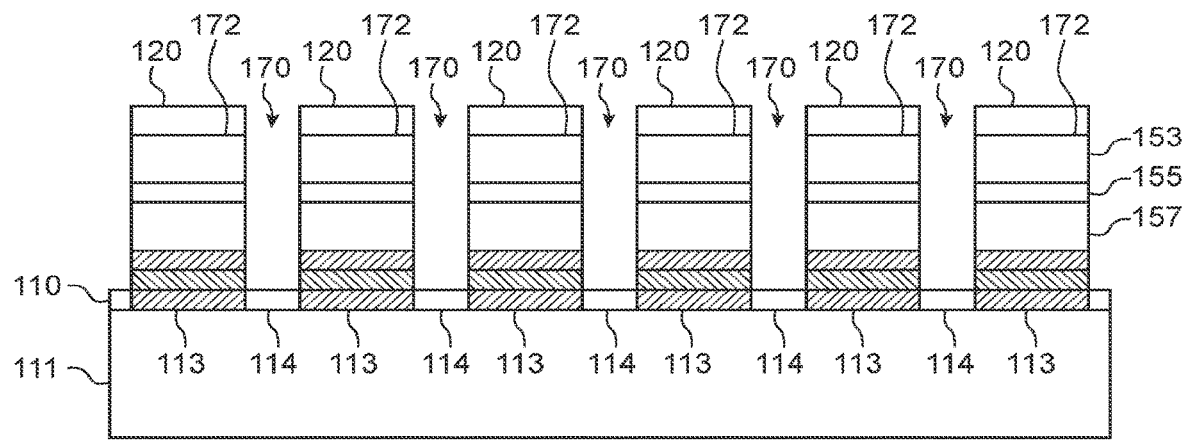

Performing step a) illustrated in FIGS. 3A to 3F may in particular comprise the steps of:

a0) providing the support substrate 111 provided on the main face 111a thereof of the integrated circuit (FIG. 3A, only the metal studs 113 and the dielectric areas 114 are shown), a1) forming a stack of layers 150 on a first face of a seed substrate 151, for example by epitaxy (FIG. 3B), a2) transferring the stack of layers 150 on the main face 111a (FIG. 3C), a3) forming trenches 170 (FIGS. 3D and 3E).

Step a3) of forming trenches 170 is in particular performed by forming a hard mask (FIG. 3D) then etching (FIG. 3E) through said mask so as to delimit the light emitting diodes 172.

In this regard, the hard mask comprises studs 120, made for example from a dielectric material, and delimiting the impression of the light emitting diodes 172 intended to be formed. The studs 120 may in particular have a thickness between 500 nm and 1.5 µm, for example 1 µm.

Figure 3F:
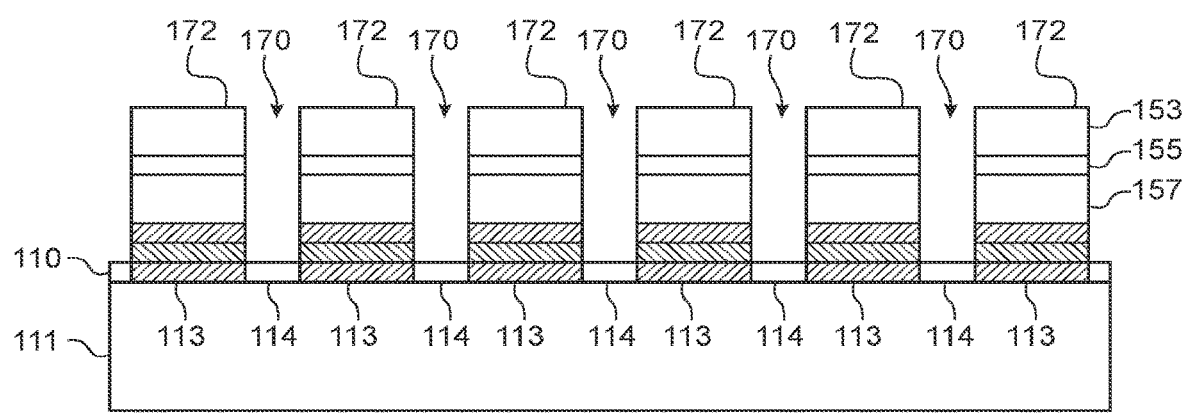

Finally, step a3) is followed by a removal of the studs 120 forming the hard mask (FIG. 3F). Said last step making it possible to advantageously reduce the aspect ratio of the structures resting on the main face 111a of the support substrate 111.

The stack formed in step a1) may comprise, from the first face of the seed substrate 151, a first N-doped semiconductor layer 153, an assembly of emitting layers 155 as well as a second P-doped semiconductor layer 157. In other terms, the light emitting diodes comprise, from the front face 151a thereof to the rear face 151b thereof, the first N-doped semiconductor layer 153, the assembly of emitting layers 155 as well as the second P-doped semiconductor layer 157. According to another variant, the order of the layers of the stack may be reversed.

Step a2) may comprise the bonding of the seed substrate (whereon the stack is formed) on the main face 111a of the support substrate 111, followed by a step of removing the seed substrate and reducing the thickness of the layer 153.

The first N-doped semiconductor layer 153 may comprise the N-doped GaN, and be of a thickness between 0.5 µm and 0.2 µm The second P-doped semiconductor layer 157 may comprise the P-doped GaN, and be of a thickness between 0.1 µm and 0.5 µm More particularly, the overall thickness of the stack 150 may be between 700 nm and 3 µm.

Each of the emitting layers of the assembly 155 may comprise a quantum well, for example based on GaN, InN, InGaN, AlGaN, AlN, AlInGaN, GaP, AlGaP, AlInGaP, or on a combination of one or more of said materials.

Alternatively, an emitting layer of the assembly 155 may be an intrinsic gallium nitride layer, that is to say not intentionally doped, for example of residual donor concentration between $10^{15}$ and $10^{18}$ atoms/cm$^3$, for example in the order of $10^{17}$ atoms/cm$^3$.

Step a2) of transferring may be preceded with the formation of one or two metal layers 116 and 159 formed, respectively, by covering the main face 111a and the free surface of the stack 150.

The two metal layers 116 and 159 are in particular placed in contact with one another during the transfer step a2) (FIG. 3C).

The metal layer 116 may comprise titanium and aluminium.

The metal layer 159 may comprise a stack of an aluminium layer and of a titanium layer, said titanium layer being intended to be in contact with the metal layer 116.

The metal layer 116 may have a thickness between 300 nm and 1 µm, for example 600 nm.

The metal layer 159 may have a thickness between 50 nm and 300 nm, for example 100 nm.

From the moment the two metal layers 116 and 159 are considered, it is understood that the trenches 170 formed in step a3) also extend over the entire combined thickness of said two layers (FIG. 3E).

The method according to the present invention also comprises step b) performed after step a).

Figure 2B:
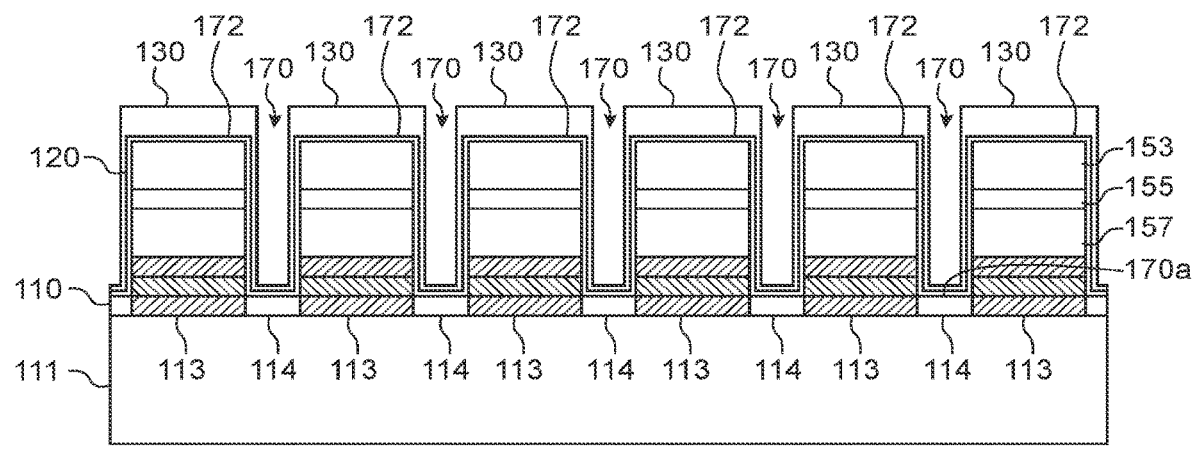

In particular step b) comprises the formation of a dielectric layer 130 by covering the front faces 151a as well as the flanks 151c and the bottom 170a of the trenches 170 (FIG. 2B).

The dielectric layer 130 has in particular a thickness E1 and a thickness E2, less than the thickness E1, at, respectively, the front faces 151a and the flanks 170a.

For example, the thickness E1 is at least 2 times greater than the thickness E2.

Still by way of example, the thickness E1 may be between 100 nm and 500 nm, for example be equal to 200 nm.

The dielectric layer 130 may be formed by a plasma-activated chemical vapour deposition technique. Said technique, insofar as same enables the non-compliant layer deposition (i.e.: having a greater deposition rate on the front face 151a opposite flanks 151c), is particularly advantageous for the embodiment of the present invention. The invention is not however limited only to this deposition technique and the person skilled in the art may use any other technique likely to deposit layers in a non-compliant manner.

The dielectric layer 130 may comprise at least one of the materials chosen from: $SiO_2$, $Si_3N_4$.

According to one advantageous variant, step b) may be preceded by step b0) of forming, according to a compliant deposition technique, a passivation layer 120 by covering the front faces 151a as well as the flanks 151c and the bottom 170a of the trenches 170.

"Compliant deposition technique" means a technique having a deposition rate substantially equal, advantageously equal, on the flanks and on the front faces. "Substantially equal" means a relative deviation less than 10%, advantageously less than 5%.

The passivation layer 120 may have a thickness between 5 nm and 30 nm, and comprise at least materials chosen from: $SiO_2$, $Al_2O_3$.

The passivation layer 120 may be formed by atomic layer deposition.

Figure 2C:
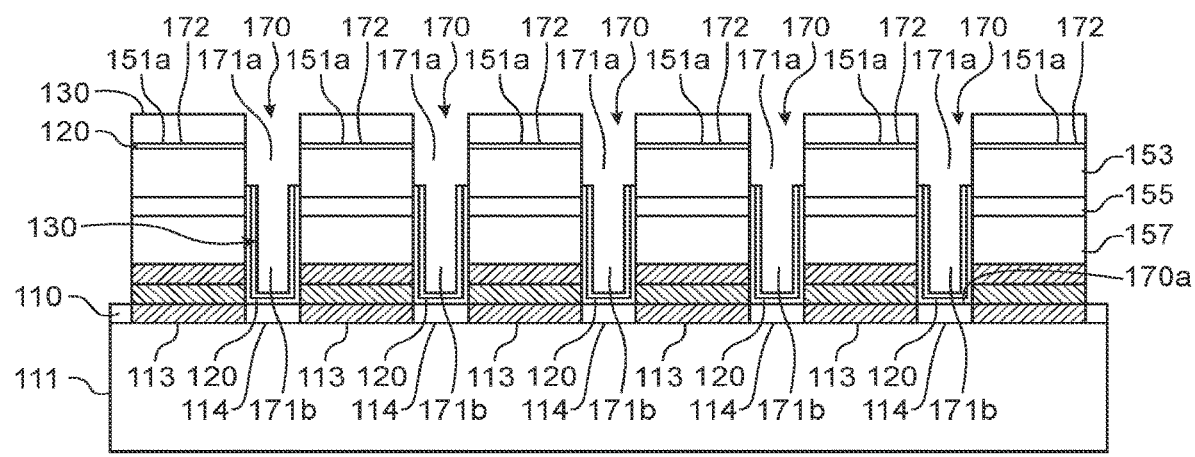
Figure 2D:
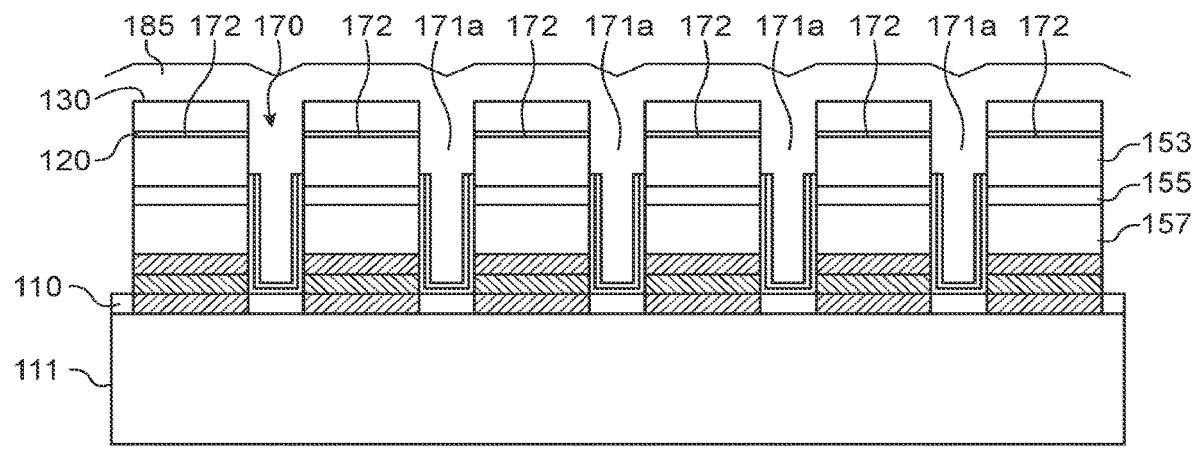
Figure 2E:
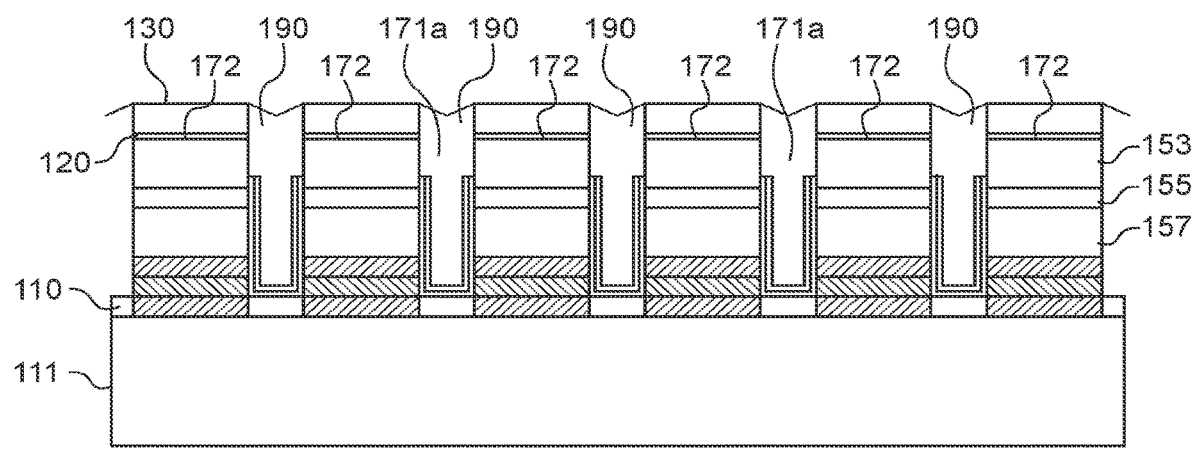

Step b) is followed by step c) of wet etching a thickness E3 of the dielectric layer 130, less than the thickness E1, and so as to uncover the flanks at a first section of the trenches 171a that extends over a first height from the front face 151a of the light emitting diodes 172 (FIG. 2C).

Step c) is moreover performed so as to keep at least partially the dielectric layer 130 on the front faces 151a.

Step c) is also performed so as to keep the dielectric layer 130 at a second section 171b of the trench 170 adjacent to the first section 171a and that extends from the first section into the bottom 170a of the trench 170.

The section of dielectric layer kept at the end of step b) will advantageously act as the layer for stopping a mechanochemical polishing step described in the remainder of the description.

If the passivation layer 120 is considered, said latter is also etched at the first section 171a.

Step c) advantageously implements the filling of the second section 171b of the trench 170 by the photolithographic resin, before the wet etching.

Advantageously, the first height is less than or equal to the thickness of the N-doped semiconductor layer.

Step c) is followed by the formation of the common electrode 190. Particularly, said method may comprise step d) of forming a metal layer 185 (FIG. 2D), in particular by electrodeposition or by CVD, by covering the front faces 151a and the trenches 170, as well as step e) of mechanochemical polishing intended to keep only the metal in the trenches 170.

"Covering the trenches" means covering the flank and the bottom.

According to the present invention, the covering of a trench does not exclude the filling thereof.

Still according to the present invention, insofar as step d) would not lead to a filling of the trench, a step of filling, by a metal species, intended to fill the void in said trench may be performed.

Particularly advantageously, step d) may be implemented according to a Damascene method.

In this regard, the portion of the dielectric layer 130 kept on the front faces 151a at the end of step c) is used as a polishing stop layer.

The metal remaining in the trenches 170 at the end of step e) forms the common electrode electrically contacting the N-doped semiconductor layers of each of the light emitting diodes at the flanks of said diodes.

The presence of the dielectric layer 130, and optionally of the passivation layer, at the second section 170b enables the common electrode to be electrically isolated from the second P-doped semiconductor layer 157 and from the assembly of emitting layers 155.

The invention is advantageously implemented when the light emitting diodes have a significant aspect ratio and in particular greater than 2. Indeed, the removal of the hard mask according to the present invention enables the topologies to be covered more easily by the dielectric layer 130 and by the passivation layer from the moment that same is considered.

Moreover, the front face (and consequently the first N-doped semiconductor layer 153) of the light emitting diodes is protected by the dielectric layer 130 during the mechanochemical polishing step.

The invention claimed is:

1. A method for forming a common electrode with a plurality of optoelectronic devices each comprising a front face and a rear face connected by a flank, the method comprising the steps of:
    a) providing a support substrate on a main face of which, rest, by a rear face thereof, the plurality of optoelectronic devices separated by trenches, the trenches being delimited by the flanks of the optoelectronic devices and a bottom at the main face;
    b) forming a dielectric layer by covering the front faces, the flanks, and the bottom of the trenches, the dielectric layer having a thickness E1 and a thickness E2, which is less than the thickness E1, at, respectively, the front faces and the flanks;
    c) wet etching a thickness E3 of the dielectric layer, the thickness E3 being less than the thickness E1, so as to uncover the flanks at a first section of the trenches and keep at least partially the dielectric layer on the front faces;
    d) forming a metal layer, by covering the trenches and the front faces; and
    e) performing a mechanochemical polishing of the metal layer, the polishing stopping on a portion of the dielectric layer kept by the covering the front faces at the end of step c), the metal layer remaining in the trenches forming the common electrode,
    wherein each trench comprises, from the bottom and adjacent to the first section, a second section, the first section and the second section extending, respectively, according to a first height and a second height, the first section leading to a plane formed by the front faces of the optoelectronic devices, and
    wherein step b) is preceded by a step b0) of forming, by a compliant deposition technique, a passivation layer by covering the front faces, the flanks, and the bottom of the trenches, the step c) also allowing for removal of the passivation layer at the first section.

2. The method according to claim 1, wherein the thickness E1 is at least 2 times greater than the thickness E2.

3. The method according to claim 1, wherein the step b0) is performed by atomic layer deposition.

4. The method according to claim 1, wherein the passivation layer comprises at least materials chosen from $SiO_2$ and $Al_2O_3$.

5. The method according to claim 1, wherein the passivation layer has a thickness between 5 nm and 30 nm.

6. The method according to claim 1, wherein the dielectric layer is formed by a plasma-activated chemical vapour deposition technique.

7. The method according to claim 1, wherein the dielectric layer comprises at least one of the materials chosen from $SiO_2$ and $Si_3N_4$.

8. The method according to claim 1, wherein the step a) comprises a transfer of a stack of layers, formed on a seed substrate, on the main face of the support substrate.

9. The method according to claim 8, wherein the transfer of the stack of layers is followed by formation of trenches that extend over an entire thickness of the stack of layers.

10. The method according to claim 9, wherein the formation of trenches implements a hard mask that is removed before performing the step b).

11. The method according to claim 1, wherein the optoelectronic devices are light emitting diodes that comprise from the front face thereof to the rear face thereof, a first N-doped semiconductor layer, an assembly of emitting layers, and a second P-doped semiconductor layer, the first height being less than or equal to a thickness of the N-doped semiconductor layer.

12. The method according to claim 11, wherein the support substrate comprises, on the main face thereof, an integrated circuit configured to individually address each of the electronic devices.

\* \* \* \* \*